(12) United States Patent
Van Blerkom et al.

(10) Patent No.: US 7,322,020 B2
(45) Date of Patent: Jan. 22, 2008

(54) CIRCUIT LAYOUT AND SEMICONDUCTOR SUBSTRATE FOR PHOTOSENSITIVE CHIP

(75) Inventors: Daniel Van Blerkom, Pasadena, CA (US); Meng-Chang Yang, Tainan (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 45 days.

(21) Appl. No.: 10/905,897

(22) Filed: Jan. 25, 2005

(65) Prior Publication Data

US 2005/0240890 A1    Oct. 27, 2005

(30) Foreign Application Priority Data

Apr. 26, 2004   (TW) .................................. 93111566

(51) Int. Cl.
 *G06F 9/45* (2006.01)
 *G06F 17/50* (2006.01)
 *G06F 9/455* (2006.01)

(52) U.S. Cl. .............................. 716/10; 716/9; 716/11

(58) Field of Classification Search ............... 716/9–11
 See application file for complete search history.

(56) References Cited

U.S. PATENT DOCUMENTS 6,046,466 A * 4/2000 Ishida et al. ................. 257/258
2004/0188729 A1* 9/2004 Uchida et al. ............... 257/292

* cited by examiner

*Primary Examiner*—Jack Chiang
*Assistant Examiner*—Suresh Memula
(74) *Attorney, Agent, or Firm*—Jianq Chyun IP Office

(57) ABSTRACT

A circuit layout for a photosensitive chip includes a semiconductor substrate, a plurality of first circuit lines and a plurality of second circuit lines. The semiconductor substrate has a matrix of photosensitive units. Each photosensitive unit has a first blocking region, a second blocking region and a photosensitive region formed on the semiconductor substrate. The first blocking region is formed between neighboring photosensitive regions aligned in a vertical direction. The second blocking region is formed between neighboring photosensitive regions aligned in a horizontal direction. Free electrons produced by illuminating the photosensitive units are blocked by the first and the second blocking regions.

5 Claims, 10 Drawing Sheets

CIRCUIT LAYOUT AND SEMICONDUCTOR SUBSTRATE FOR PHOTOSENSITIVE CHIP

CROSS-REFERENCE TO RELATED APPLICATION

This application claims the priority benefit of Taiwan application serial no. 93111566, filed Apr. 26, 2004.

BACKGROUND OF THE INVENTION

1. Field of the Invention

The present invention relates to a circuit layout and a semiconductor chip for a photosensitive chip. More particularly, the present invention relates to a circuit layout and a semiconductor substrate for a photosensitive chip that can reduce signal interference.

2. Description of Related Art

The rapid progress in electronic communication has brought about an explosion in the transmission of information. Portable electronic devices can be conveniently used to transmit data at an inexpensive and efficient way. To capture an image, for example, an image-capturing device is used. Most image-capturing devices utilize a photosensitive chip to capture image data and then convert the captured analogue image data into digital data signals with an analogue/digital converter. Thereafter, the digital image data signals can be archived, transmitted or further processed. In general, each image sensor has a plurality of photosensitive units and the output voltage from each photosensitive unit changes in proportional to the illumination level. For example, an increase in the intensity of illumination will lead to a drop in the output voltage from a photosensitive unit.

FIG. 1 is an equivalent circuit diagram of a photosensitive unit within a conventional photosensitive chip. As shown in FIG. 1, the photosensitive unit 20 comprises a photo-diode 21 and a plurality of transistors 23, 24 and 25. A power terminal 26 is electrically connected to the drain of the transistors 23 and 24. The source of the transistor 23, the cathode of the photo-diode 21 and the gate of the transistor 24 are electrically connected together. The anode of the photo-diode 21 is electrically connected to a ground terminal 27. The source of the transistor 24 and the drain of the transistor 25 are electrically connected and the signal produced by the photosensitive unit 21 is output from the source of the transistor 25.

The photosensitive chip comprises a semiconductor substrate and a plurality of circuit layers as shown in FIGS. 2 through 5. FIG. 2 is a top view showing N-doped regions above a P-type substrate of a conventional photosensitive unit. FIG. 3 is a top view showing N-doped regions and polysilicon circuit layers above a P-type substrate of a conventional photosensitive unit. FIG. 4 is a top view showing N-doped regions and a metallic circuit layers above a P-type substrate of a conventional photosensitive unit. FIG. 5 is a top view showing N-doped regions and another metallic circuit layers above a P-type substrate of a conventional photosensitive unit.

As shown in FIG. 2, the semiconductor substrate 110 has a P-type substrate 120, and a plurality of N-doped regions 131, 132, 133, 134 and a matrix of photosensitive units 112 are formed on a surface of the semiconductor substrate 110. Each photosensitive unit 112 has a photosensitive region 114. The aforementioned photo-diode 21 is formed within the photosensitive region 114. In general, the photo-diode 21 operates with a reverse biased p-n junction. When photons bombard the photo-diode 21, the electron-hole pairs inside the depletion region will separate from each other and hence an electric current will flow from the N-doped region 131 within the photosensitive region 114 to the P-type substrate 120 and finally will flow to the ground terminal 27.

As shown in FIG. 3, the hatched areas indicate the locations of polysilicon circuit lines 141, 142 and 143. The line 141 crosses over neighboring N-doped regions 131 and 132; the line 142 crosses over neighboring N-doped regions 132 and 133; and the line 143 crosses over neighboring N-doped regions 133 and 134. The N-doped regions 131, 132, 133, 134 on each side of the polysilicon circuit lines 141, 142 and 143 form the source or the drain of MOS transistors 151, 152 and 153. The polysilicon circuit lines 141, 142, 143 serve as the gates of the MOS transistors 151, 152, 153. In FIG. 3, the transistor 151 on the semiconductor substrate 110 corresponds in position to the transistor 23 shown in FIG. 1. The transistor 152 on the semiconductor substrate 110 corresponds in position to the transistor 24 shown in FIG. 1. The transistor 153 on the semiconductor substrate 110 corresponds in position to the transistor 25 shown in FIG. 1. The source of the transistor 151 and the N-doped region 131 within the photosensitive region 114 are electrically connected. The drain of the transistor 151 and the drain of the transistor 152 are electrically connected through the N-doped region 132. The source of the transistor 152 and the drain of the transistor 153 are electrically connected through the N-doped region 133. The source of the transistor 153 and a signal output terminal 160 are electrically connected through the N-doped region 134.

As shown in FIG. 4, the areas with slash lines represent the metallic circuits 171 and 172 above the polysilicon circuits. The N-doped region 131 within the photosensitive region 114 and the gate of the transistor 152 are electrically connected through the conductive plugs 181, 182 and the metallic circuit 171. The metallic circuit 172 and the gate of the transistor 151 are electrically connected through the conductive plugs 183.

As shown in FIG. 5, the hatched areas represent the metallic circuits 191 above the polysilicon circuits. The metallic circuits 191 and the N-doped region 132 are electrically connected through the conductive plugs 184, wherein the metallic circuits 191 are connected to a power terminal 26.

In the above layout of the photosensitive chip, the N-doped regions 132, 133, 134 are positioned between the photosensitive regions 114 of neighboring photosensitive units 112. When the photosensitive regions 114 are illuminated, photons will bombard the photo-diode 21 and separate the electron-hole pairs within the depletion region at the junction between the N-doped region 131 and the P-type substrate 120. The free electrons will move in a random direction. Some of the free electrons drifting to the left or to the right are absorbed by the N-doped regions 132, 133, 134 and thereby interference with the determination of light intensity by neighboring photosensitive units 112 can be reduced.

However, the aforementioned type of circuit layout on the photosensitive chip has no barrier between neighboring upper and lower photosensitive regions 114 for preventing free electrons from drifting up or down to the N-doped regions 131 within neighboring upper and lower photosensitive regions 114. The light intensity level determined by the photosensitive units 112 will be affected by the interference from upper or lower ones. When an interference from the neighboring photosensitive units 112 occurs, the contrast at the border of a picture will be fuzzy and the degree of coloration of colors will drop as well. Furthermore, with the reduction of pixel dimension, the capacitance of the photo-diode 21 will decrease. Consequently, the photo-diode 21 is increasingly subjected to the interference of noise signals.

SUMMARY OF THE INVENTION

Accordingly, the present invention is directed to a circuit layout and a semiconductor substrate for a photosensitive chip. A blocking region is set up between neighboring upper and lower photosensitive regions so that free electrons drifting up or down into the N-doped regions inside neighboring upper and lower photosensitive regions can be effectively reduced. Ultimately, the accuracy of the photosensitive units for determining light intensity is improved.

According to an embodiment of the present invention, the photosensitive chip comprises a semiconductor substrate, a plurality of first circuit lines and a plurality of second circuit lines. A plurality of photosensitive units is disposed on a surface of the semiconductor substrate and is arranged to form a matrix with a plurality of rows and columns. All the photosensitive units in the same row are laid down in a first direction and all the photosensitive units in the same columns are laid down in a second direction. The first direction is positioned at an angle relative to the second direction. Each photosensitive unit comprises a first blocking region, a second blocking region and a photosensitive region formed on the surface of the semiconductor substrate. Each first blocking region further comprises a source and a drain. The first circuit lines are laid over the surface of the semiconductor substrate in parallel to each other and oriented in the first direction. The source and the drain of each first blocking region are positioned on each side of a corresponding first circuit line and are oriented in the first direction. The first circuit line, the source and the drain constitute a transistor of a corresponding photosensitive unit. The transistor is located between two neighboring photosensitive regions aligned in the second direction. The second circuit lines are laid over the surface of the semiconductor substrate in parallel to each other and oriented in the second direction. The second circuit lines cross over the first circuit lines. The second blocking region of each photosensitive unit is positioned under a corresponding second circuit line between neighboring photosensitive regions aligned in the first direction.

According to one embodiment of the present invention, the circuit layout of the photosensitive chip further comprises a plurality of third circuit lines formed in parallel to each other over the surface of the semiconductor substrate and aligned in the first direction. Furthermore, the third circuit lines are located above the corresponding first circuit lines and blocking the source. Moreover, the source of each photosensitive unit is closer to a neighboring photosensitive unit compared to the drain of the photosensitive unit. However, the third circuit lines may also cover the drain besides the source.

In each photosensitive unit, the longitudinal dimension of the transistor in the first direction is roughly between 2 μm to 10 μm, for example, and the source, the drain, the second blocking region are N-doped regions.

In brief, the present invention is directed to a first blocking region and a second blocking region between the photosensitive region of neighboring photosensitive units. When the photosensitive regions are illuminated to produce random drifting free electrons, the first blocking region and the second blocking region around the photosensitive region will absorb the free electrons. Thus, the free electrons drifting to other neighboring photosensitive units and affecting their normal operations can be substantially reduced. Therefore, interference of the free electrons in the determination of light intensity of the light illuminating the region can be effectively reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
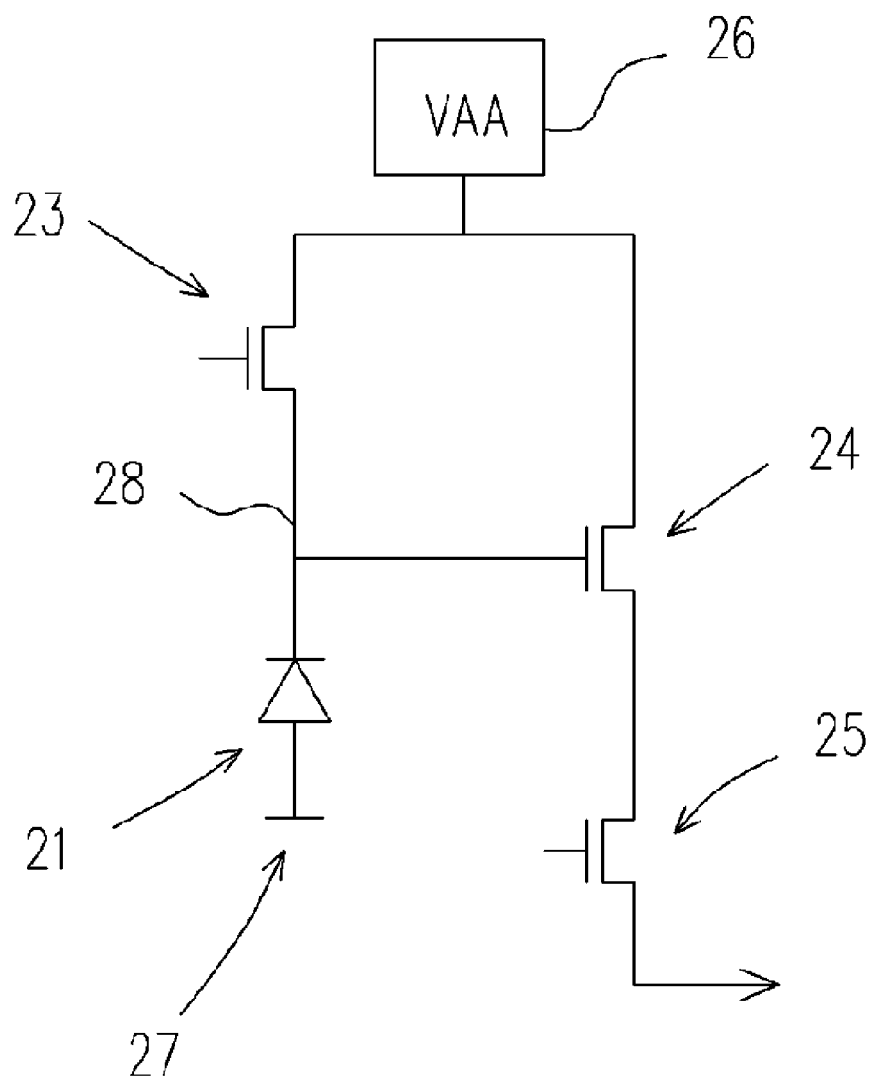
FIG. 1 is an equivalent circuit diagram of a photosensitive unit within a conventional photosensitive chip.
Figure 2:
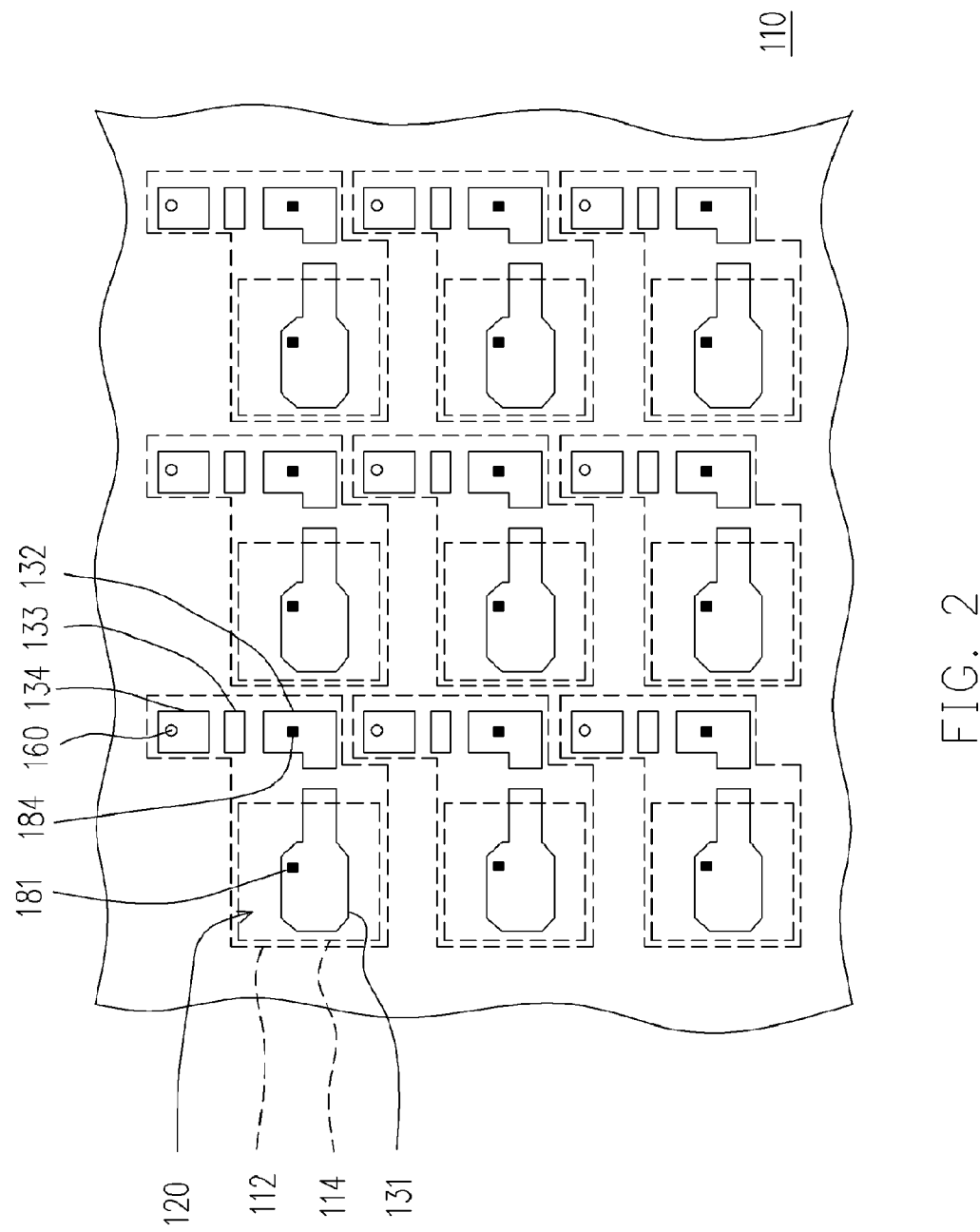
FIG. 2 is a top view showing N-doped regions above a P-type substrate of a conventional photosensitive unit.
Figure 3:
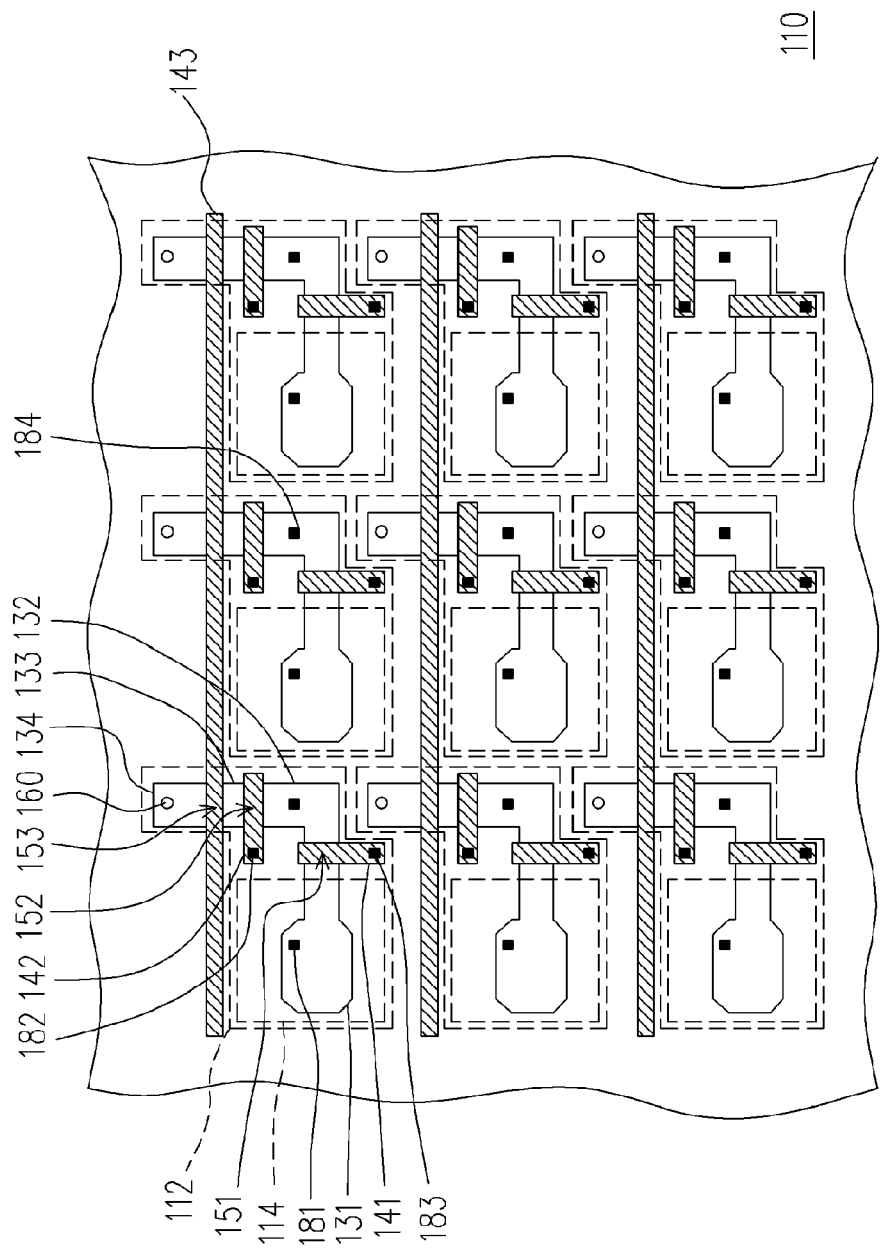
FIG. 3 is a top view showing N-doped regions and polysilicon circuit layers above a P-type substrate of a conventional photosensitive unit.
Figure 4:
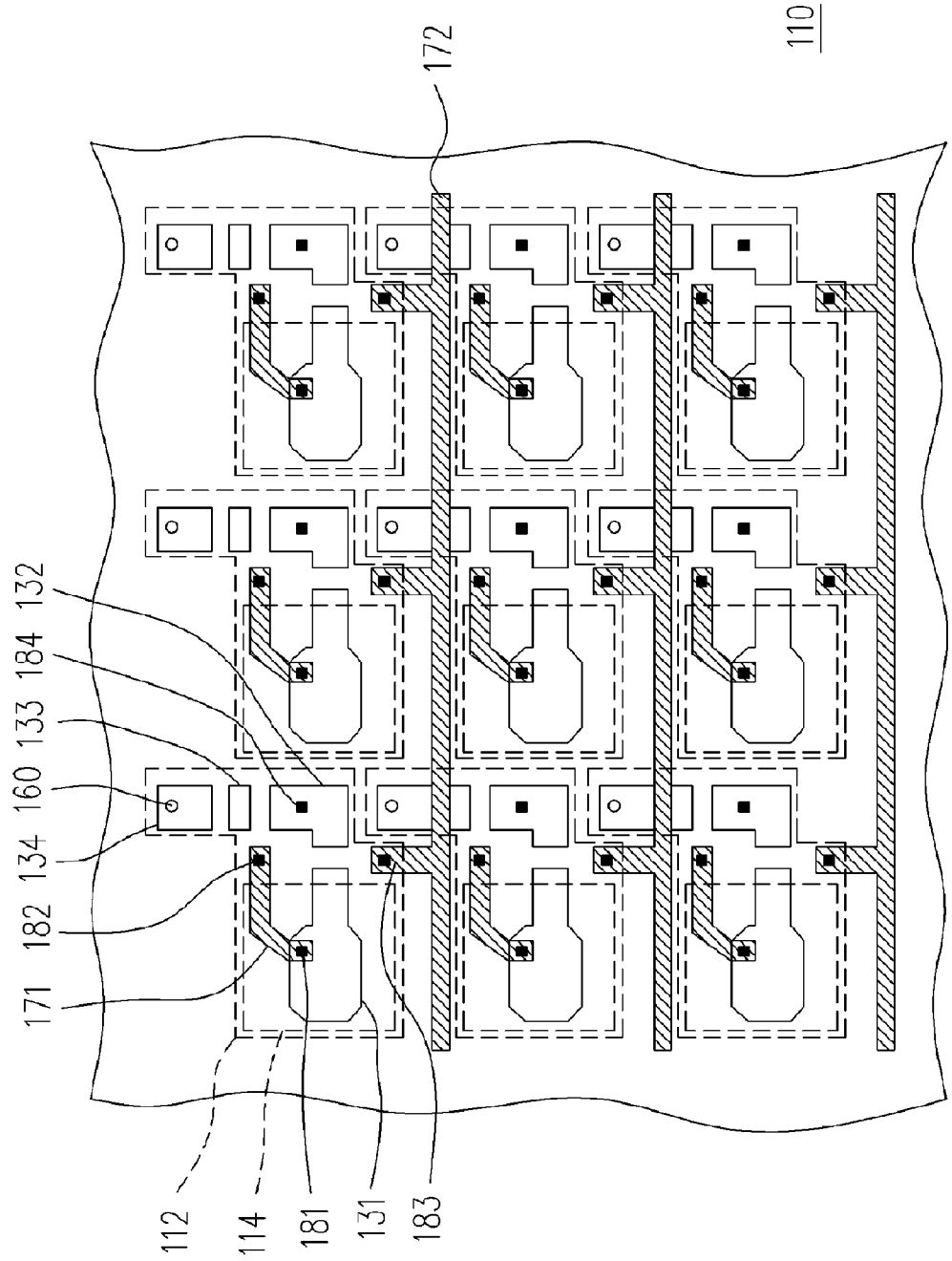
FIG. 4 is a top view showing N-doped regions and a metallic circuit layers above a P-type substrate of a conventional photosensitive unit.
Figure 5:
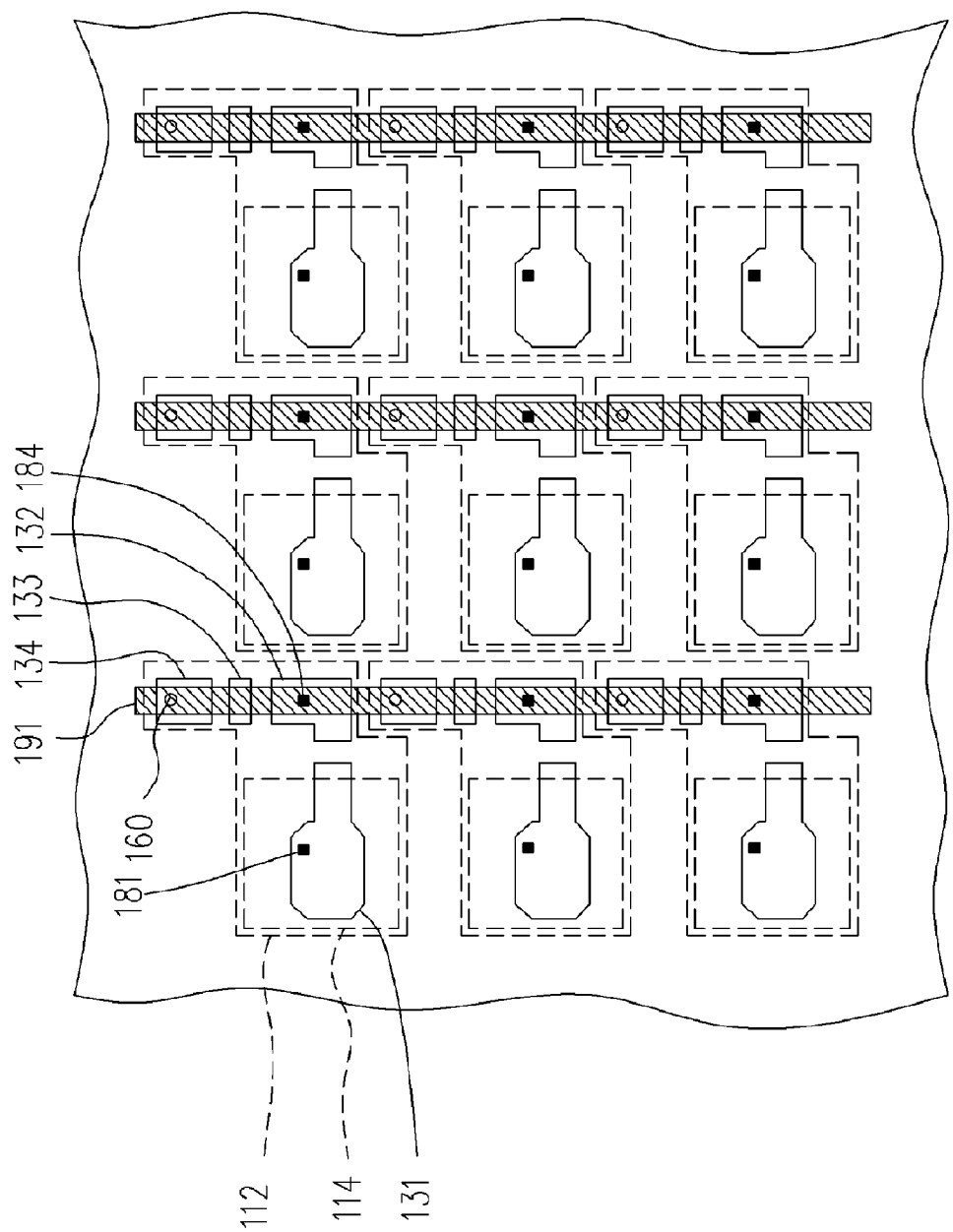
FIG. 5 is a top view showing N-doped regions and another metallic circuit layers above a P-type substrate of a conventional photosensitive unit.

Reference will now be made in detail to the present preferred embodiments of the invention, examples of which are illustrated in the accompanying drawings. Wherever possible, the same reference numbers are used in the drawings and the description to refer to the same or like parts.

The photosensitive units of the present invention has an equivalent circuit diagram identical to the one in FIG. 1. Since the circuit has been described in detail in a foregoing section, no repetition is attempt here. One major aspect of the present invention is some modification of the circuit layout on the photosensitive chip so that randomly drifting electrons are prevented from moving into N-doped regions of neighboring photosensitive units as shown in FIGS. 6 through 9.

Figure 6:
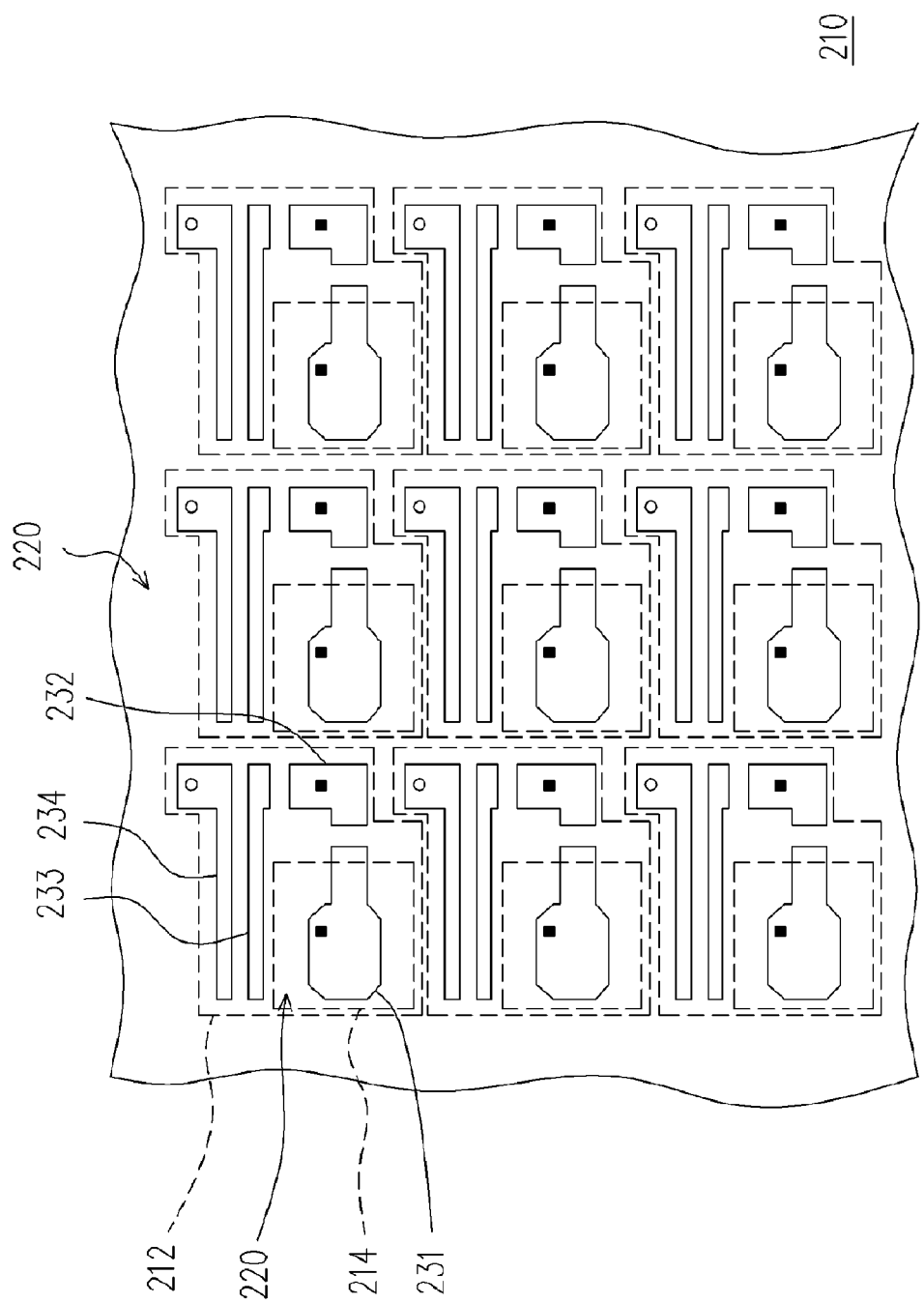
FIG. 6 is a top view showing N-doped regions above a P-type substrate according to one embodiment of the present invention.
Figure 7:
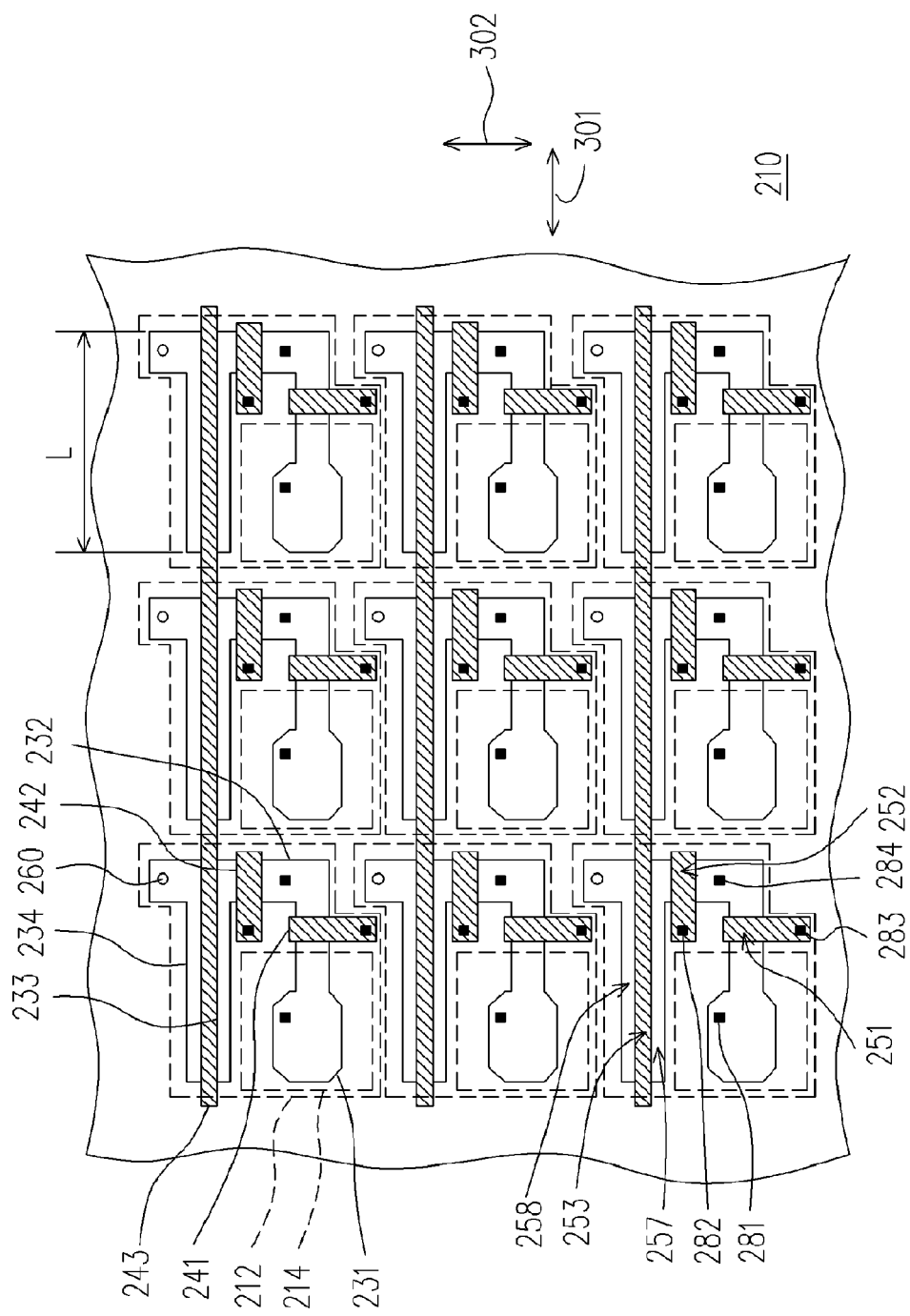
FIG. 7 is a top view showing N-doped regions above a P-type substrate and polysilicon circuit layers according to one embodiment of the present invention.
Figure 8:
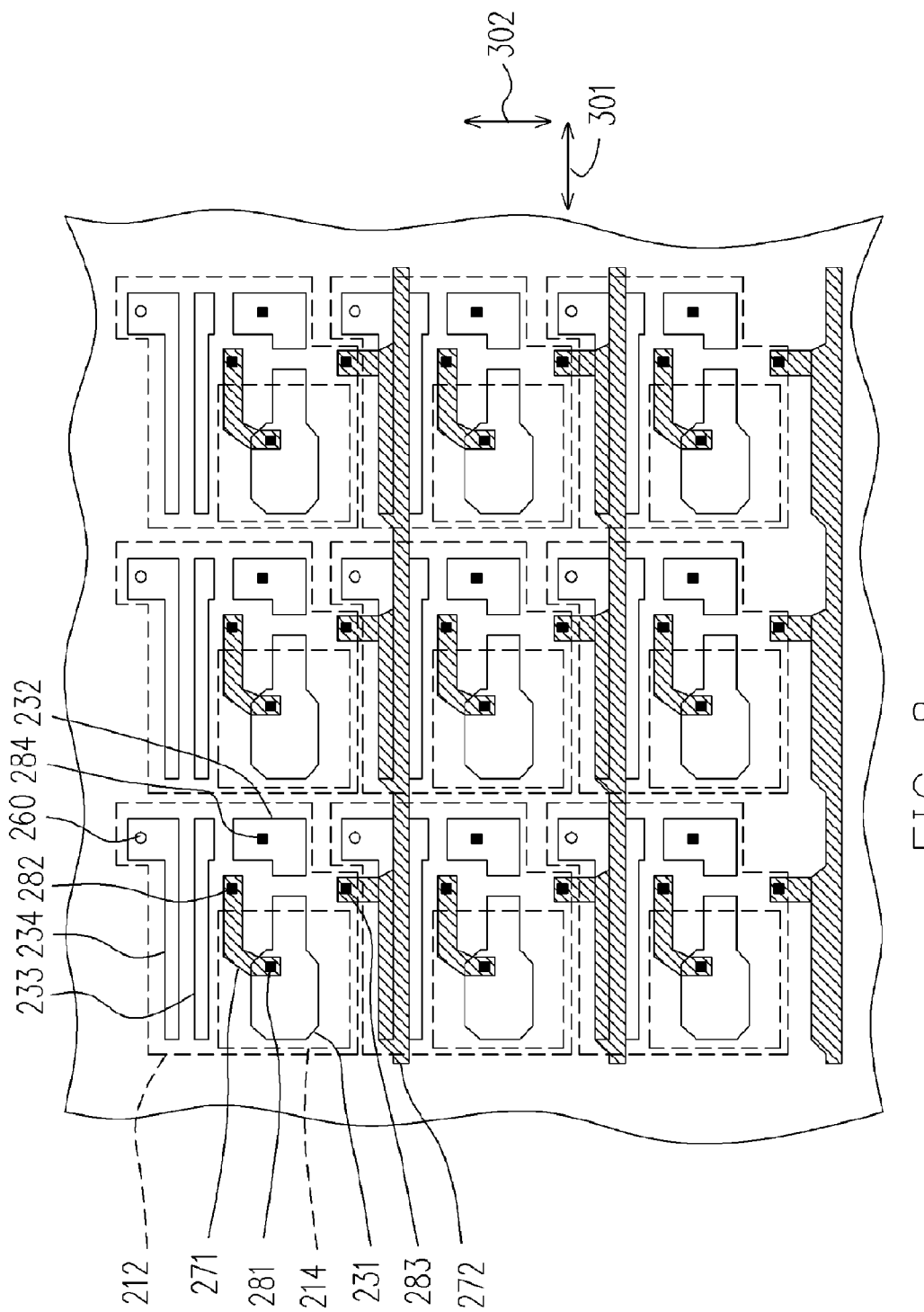
FIG. 8 is a top view showing N-doped regions above a P-type substrate and a metallic circuit layers according to one embodiment of the present invention.
Figure 9:
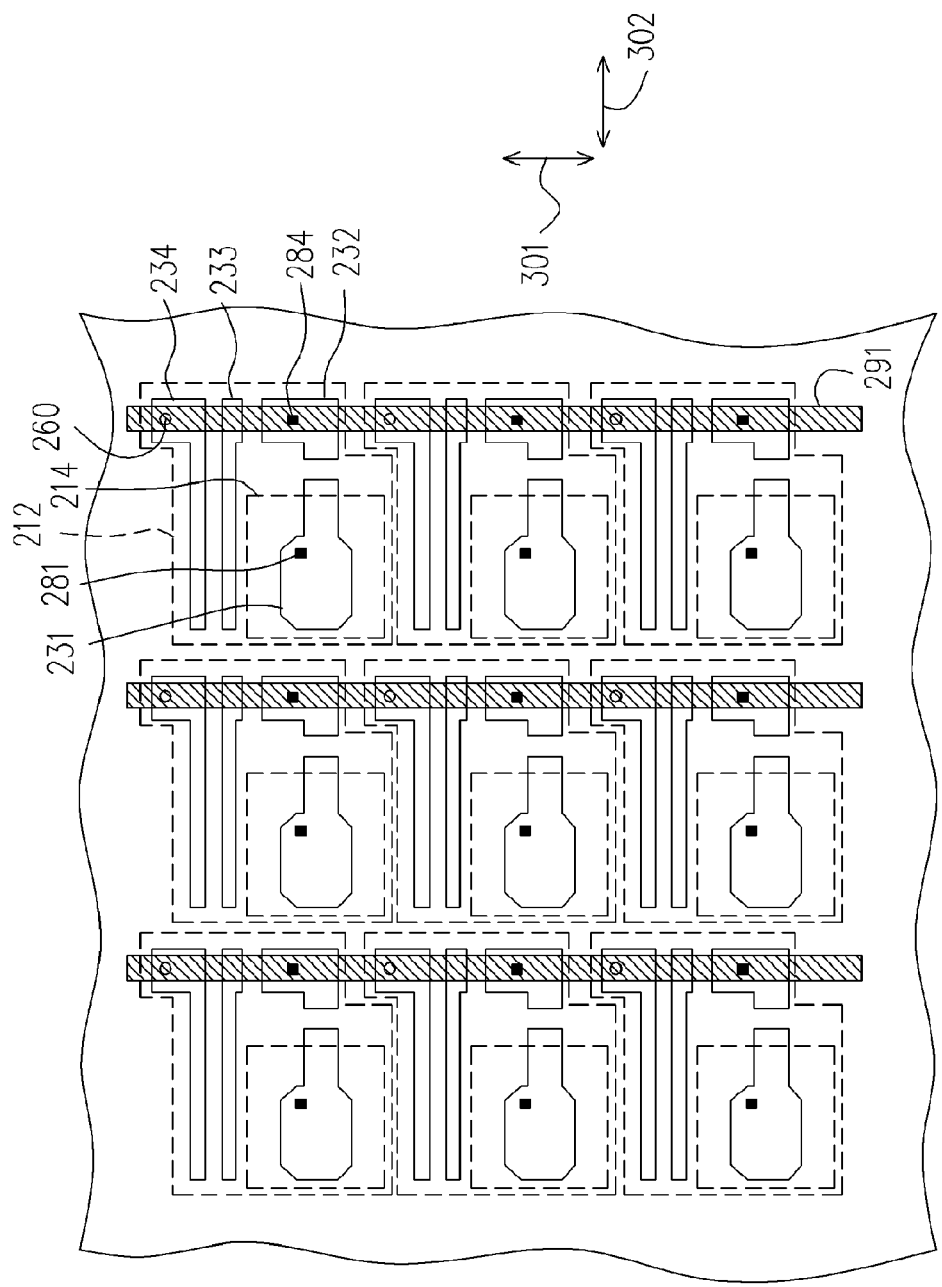
FIG. 9 is a top view showing N-doped regions above a P-type substrate and another metallic circuit layers according to one embodiment of the present invention.

FIG. 6 is a top view showing N-doped regions above a P-type substrate according to one embodiment of the present invention. FIG. 7 is a top view showing N-doped regions above a P-type substrate and polysilicon circuit layers according to one embodiment of the present invention. FIG. 8 is a top view showing N-doped regions above a P-type substrate and a metallic circuit layers according to one embodiment of the present invention. FIG. 9 is a top view showing N-doped regions above a P-type substrate and another metallic circuit layers according to one embodiment of the present invention.

As shown in FIG. 6, the semiconductor substrate 210 has a P-type substrate 220 and a plurality of N-doped regions 231, 232, 233, 234 and a matrix of photosensitive units 212 on a surface of the semiconductor substrate 210. Each photosensitive unit 212 comprises a photosensitive region 214. The aforementioned photo-diode 21 in FIG. 1 is formed within the photosensitive region 214. In general, the photo-diode 21 operates with a reverse biased p-n junction. When photons bombard the photo-diode 21, the electron-hole pairs inside the depletion region will separate from each other and hence an electric current will flow from the N-doped region 231 within the photosensitive region 214 to the P-type substrate 220 and finally will flow to the ground terminal 27.

As shown in FIG. 7, the areas with slash lines indicate the locations of polysilicon circuit lines 241, 242 and 243. The line 241 crosses over neighboring N-doped regions 231 and 232; the line 242 crosses over neighboring N-doped regions 232 and 233; and the line 243 crosses over neighboring N-doped regions 233 and 234. The N-doped regions 231, 232, 233, 234 on each side of the polysilicon circuit lines 241, 242 and 243 form the source or the drain of MOS transistors 251, 252 and 253. The polysilicon circuit lines 241, 242, 243 serve as the gates of the MOS transistors 151, 152, 153. In FIG. 7, the transistor 251 on the semiconductor substrate 210 corresponds in position to the transistor 23 shown in FIG. 1. The transistor 252 on the semiconductor substrate 210 corresponds in position to the transistor 24 shown in FIG. 1. The transistor 253 on the semiconductor substrate 210 corresponds in position to the transistor 25 shown in FIG. 1.

It should be noted that the drain 257 of the transistor 253 is provided by the N-doped region 233 and the source 258 of the transistor 253 is provided by the N-doped region 234. Furthermore, the drain 257 and the source 258 of the transistor 253 are located on each side of the polysilicon circuit line 243 that serves as a gate for the transistor 253. The drain 257, the source 258 and the polysilicon circuit line 243 of the transistor 253 extend in a first direction 301. Preferably, the longitudinal dimension L of the source 257 and the drain 258 of the transistor 253 in the first direction 301 is between 2 μm to 10 μm.

The source of the transistor 251 and the N-doped region 231 within the photosensitive region 214 are electrically connected. The drain of the transistor 251 and the drain of the transistor 252 are electrically connected through the N-doped region 232. The source of the transistor 252 and the drain 257 of the transistor 253 are electrically connected through the N-doped region 233. The source 258 of the transistor 253 and a signal output terminal 260 are electrically connected through the N-doped region 234.

As shown in FIG. 8, the hatched areas represent the metallic circuits 271 and 272 above the polysilicon circuits. The N-doped region 231 within the photosensitive region 214 and the gate of the transistor 252 are electrically connected through conductive plugs 281, 282 and the metallic circuit 271. The metallic circuit 272 extending in the first direction 301 and the gate of the transistor 251 are electrically connected through a conductive plug 283. The metallic circuit 272 blocks the source 258 of the transistor 253. The source 258 of the transistor 253 is closer to the photosensitive unit 212 of a neighboring photosensitive unit than the drain 257 of the transistor 253. Furthermore, the source 258 of the transistor 253 is further away from the photosensitive region 214 inside the photosensitive unit 212 but closer to the photosensitive region 214 of a neighboring photosensitive unit 212. To prevent the light shining on a neighboring photosensitive region 214 from affecting the source 258 of the transistor 253 and the output from the photosensitive units 212, the metallic circuit 272 is utilized to cover the source 258 of the transistor 253.

As shown in FIG. 9, the hatched areas represent the metallic circuits 291 extending in the second direction 302 above the polysilicon circuits. The second direction 302 is substantially perpendicular to the first direction 301. The metallic circuits 291 cross over the N-doped regions 232, 233 and 234. The metallic circuit 291 and the N-doped regions 232 are electrically connected through conductive plugs 284 and the metallic circuits 291 are connected to a power terminal 26.

In the aforementioned circuit layout of the photosensitive chip, the N-doped regions 232, 233 and 234 are disposed between neighboring photosensitive units 212. When the photosensitive regions 214 are illuminated, photons will bombard the photo-diode 21 and separate the electron-hole pairs within the depletion region at the junction between the N-doped region 231 and the P-type substrate 220. The free electrons will move randomly in all directions. Because the N-doped regions 232, 233 and 234 disposed around the photosensitive region 214 can absorb the free electrons, the electrons are prevented from drifting to the N-doped regions 231 within neighboring photosensitive units 212. Therefore, interference of free electrons in determination of light intensity of the light illuminating the region can be avoided.

Figure 10:
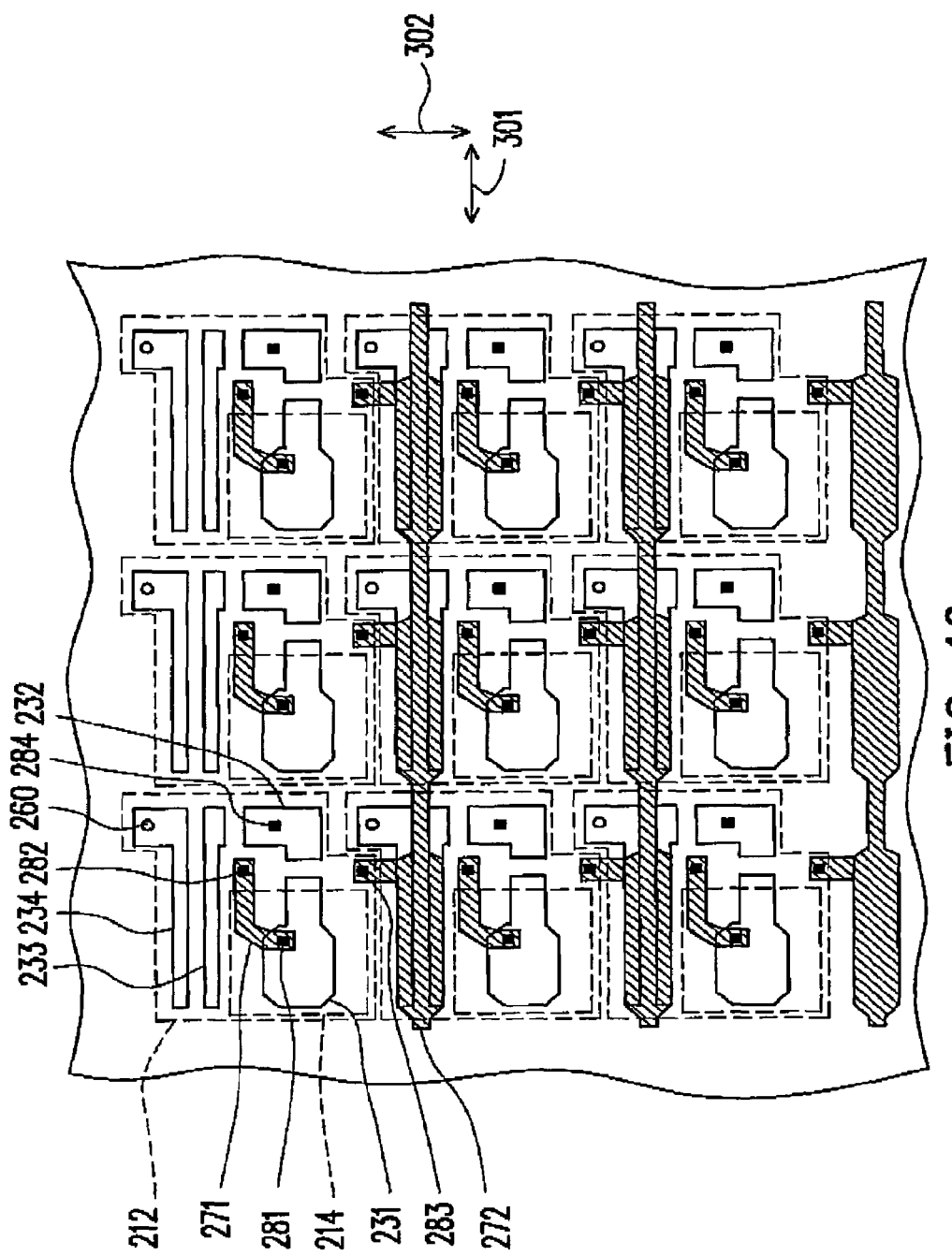
FIG. 10 is a top view showing N-doped regions above a P-type substrate and a metallic circuit layers according to another embodiment of the present invention.

The applications of the present invention are not limited to the one in the aforementioned description. Aside from covering the source of the transistor, the metallic circuit 272 may be deployed to further cover the drain of a transistor as shown in FIG. 10 and a metallic circuit layers according to another preferred embodiment of the present invention. Since all the other sections are identical to the aforementioned embodiment, a detailed description is omitted.

In summary, the present invention provides N-doped regions between the photosensitive region of neighboring photosensitive units. When the photosensitive regions are illuminated to produce random drifting free electrons, the N-doped regions around the photosensitive region will absorb the free electrons. Thus, the free electrons drifting to other neighboring photosensitive units affecting their normal operations can be substantially reduced. Therefore, the interference of free electrons in determination of light intensity of the light illuminating the region can be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A circuit layout for a photosensitive chip, comprising:
a semiconductor substrate, having a matrix of photosensitive units, the photosensitive units aligned in a row in a first direction, the photosensitive units aligned in a column in a second direction, wherein the second direction is positioned at an angle relative to the first direction, wherein each said photosensitive unit comprises a first blocking region, a second blocking region and a photosensitive region, and each said first blocking region comprises a source and a drain;

a plurality of first circuit lines, formed over the semiconductor substrate in parallel extending in the first direction, wherein the source and the drain of each said first blocking region are located on both sides of the corresponding first circuit lines extending in the first direction, a part of the source and a part of the drain are located between the corresponding neighboring photosensitive regions aligned in the second direction, and the first circuit line, the source and the drain together form a transistor, the transistor extending as a barrier between the neighboring photosensitive regions aligned in the second direction;

a plurality of second circuit lines, formed over the semiconductor substrate in parallel extending in the second direction, the second circuit lines crossing over the first circuit lines, wherein the second blocking region of each said photosensitive unit is located under the corresponding second circuit line, the second circuit line being positioned between neighboring photosensitive regions aligned in the first direction; and a plurality of parallel third circuit lines formed over the semiconductor substrate extending in the first direction, wherein the third circuit lines are located above the corresponding first circuit lines, and each said third circuit line covers the source, and wherein the source is closer to a neighboring photosensitive unit compared to the drain.

2. The circuit layout of claim 1, wherein the third circuit line further covers the drain.

3. The circuit layout of claim 1, wherein the source and the drain are N-doped regions.

4. The circuit layout of claim 1, wherein the second blocking region is an N-doped region.

5. A circuit layout for a photosensitive chip, comprising:
a semiconductor substrate, having a matrix of photosensitive wilts, the photosensitive units aligned in a row in a first direction, the photosensitive units aligned in a column in a second direction, wherein the second direction is positioned at an angle relative to the first direction, wherein each said photosensitive unit comprises a first blocking region, a second blocking region and a photosensitive region, and each said first blocking region comprises a source and a drain;

a plurality of first circuit lines, formed over the semiconductor substrate in parallel extending in the first direction, wherein the source and the drain of each said first blocking region are located on both sides of the corresponding first circuit lines extending in the first direction, the first circuit line, the source and the drain together form a transistor, and the transistor is positioned between neighboring photosensitive regions aligned in the second direction; and a plurality of second circuit lines, formed over the semiconductor substrate in parallel extending in the second direction, the second circuit lines crossing over the first circuit lines, wherein the second blocking region of each said photosensitive unit is located under the corresponding second circuit line, and the second circuit line is between neighboring photosensitive regions aligned in the first direction, wherein a longitudinal dimension of the transistor in the first direction is between about 2 μm to 10 μm.

* * * * *